United States Patent
Kang et al.

(10) Patent No.: US 8,399,274 B2
(45) Date of Patent: Mar. 19, 2013

(54) ORGANIC LIGHT EMITTING DISPLAY AND METHOD OF MANUFACTURING THE SAME

(75) Inventors: Ki-Nyeng Kang, Yongin (KR); Young-Shin Pyo, Yongin (KR); Dong-Un Jin, Yongin (KR)

(73) Assignee: Samsung Display Co., Ltd. (KR)

(*) Notice: Subject to any disclaimer, the term of this patent is extended or adjusted under 35 U.S.C. 154(b) by 334 days.

(21) Appl. No.: 12/833,857

(22) Filed: Jul. 9, 2010

(65) Prior Publication Data
US 2011/0104833 A1    May 5, 2011

(51) Int. Cl.
*H01L 51/56* (2006.01)
*H01L 21/84* (2006.01)
*H01L 51/50* (2006.01)
*H01L 27/32* (2006.01)

(52) U.S. Cl. ..... 438/45; 438/29; 438/104; 257/E51.018; 257/E29.095; 257/E33.019

(58) Field of Classification Search ............ 438/23, 438/29, 34, 104, 155, 158, 162, 45; 257/57, 257/E29.094, E29.095, E33.019, E33.053, 257/E51.018
See application file for complete search history.

(56) References Cited

U.S. PATENT DOCUMENTS

| 6,088,071 | A | 7/2000 | Yamamoto et al. |
| 7,459,354 | B2* | 12/2008 | Yamazaki et al. ............. 438/159 |
| 8,158,979 | B2* | 4/2012 | Kang et al. ..................... 257/43 |
| 8,278,665 | B2* | 10/2012 | Asanuma et al. ............... 257/72 |
| 2006/0197092 | A1 | 9/2006 | Hoffman et al. |
| 2008/0042138 | A1* | 2/2008 | Park et al. ........................ 257/72 |
| 2008/0048148 | A1* | 2/2008 | Borovik et al. ........... 252/183.11 |
| 2008/0128689 | A1* | 6/2008 | Lee et al. ......................... 257/43 |
| 2008/0208797 | A1* | 8/2008 | Witzke et al. ..................... 707/2 |
| 2009/0050894 | A1* | 2/2009 | Park et al. ........................ 257/72 |
| 2009/0189160 | A1* | 7/2009 | Ahn et al. ....................... 257/66 |
| 2009/0321732 | A1* | 12/2009 | Kim et al. ....................... 257/43 |
| 2010/0006845 | A1* | 1/2010 | Seo et al. ........................ 257/59 |
| 2010/0026169 | A1* | 2/2010 | Jeong et al. .................... 313/504 |
| 2010/0065845 | A1* | 3/2010 | Nakayama ..................... 257/43 |
| 2010/0084648 | A1* | 4/2010 | Watanabe ....................... 257/43 |
| 2011/0006306 | A1* | 1/2011 | Yamazaki et al. ............... 257/72 |
| 2011/0104833 | A1* | 5/2011 | Kang et al. ..................... 438/23 |
| 2011/0127519 | A1* | 6/2011 | Kang et al. ..................... 257/43 |
| 2011/0215335 | A1* | 9/2011 | Kwon et al. .................... 257/71 |

FOREIGN PATENT DOCUMENTS

| JP | 2003-303687 | 10/2003 |
| JP | 2007-73699 | 3/2007 |
| JP | 2008-134625 | 6/2008 |
| JP | 2009-031742 | 2/2009 |
| JP | 2009-099953 | 5/2009 |
| KR | 19980071773 | 10/1998 |
| KR | 1020090105560 | 7/2009 |
| KR | 1020090105561 | 7/2009 |

OTHER PUBLICATIONS

Office Action dated Jan. 31, 2012 in corresponding Japanese Patent Application No. 2010-030191.
Notice of Allowance dated Sep. 28, 2011 in Korean Priority Patent Application No. 10-2009-0105985.

* cited by examiner

*Primary Examiner* — Mary Wilczewski
(74) *Attorney, Agent, or Firm* — Knobbe Martens Olson & Bear LLP

(57) ABSTRACT

An organic light emitting display is disclosed. The display has a pixel which includes a transistor and a capacitor. The active layer of the transistor and at least one of the electrodes of the capacitor comprise a semiconductor oxide.

12 Claims, 2 Drawing Sheets

ORGANIC LIGHT EMITTING DISPLAY AND METHOD OF MANUFACTURING THE SAME

CROSS-REFERENCE TO RELATED APPLICATION

This application claims priority to and the benefit of Korean Patent Application No. 10-2009-0105985, filed on Nov. 4, 2009, in the Korean Intellectual Property Office, the entire content of which is incorporated herein by reference.

BACKGROUND

1. Field

The field relates to a method of manufacturing an organic light emitting display, and more particularly, to a method of manufacturing an organic light emitting display including a thin film transistor (TFT) in which oxide semiconductor is used as an active layer and including a capacitor having a metal-oxide-semiconductor (MOS) structure, and a method of manufacturing the same.

2. Description of the Related Technology

In general, a thin film transistor (TFT) includes an active layer providing a channel region, a source region, and a drain region and a gate electrode insulated from the active layer of the channel region by a gate insulating layer.

The active layer of the TFT is made of a semiconductor such as amorphous silicon or poly-silicon. When the active layer is made of amorphous silicon, mobility is low so that it is difficult to realize a driving circuit driven at high speed. When the active layer is made of poly-silicon, since mobility is high but a threshold voltage is not uniform, a compensation circuit must be added.

In addition, it is difficult to apply a conventional TFT manufacturing method using low temperature poly-silicon (LTPS) to a large area substrate since a high-price process such as laser heat treatment is included and TFT characteristic control is difficult.

In order to solve the above-described problems, research on using an oxide semiconductor as the active layer have been recently performed.

In Japanese Patent Publication No. 2004-273614, a TFT in which an oxide semiconductor using zinc oxide (ZnO) as a main component is used as the active layer is disclosed.

The oxide semiconductor having ZnO used as the main component is estimated as an amorphous and stable material. When the oxide semiconductor is used as the active layer, the TFT may be manufactured by the conventional LTPS process at a low temperature no more than 300° C.

However, when the oxide semiconductor is used as the active layer, since the lower and upper electrodes of a capacitor are to be formed in the processes of forming the gate electrode and the source and drain electrodes of the TFT, the capacitor may be realized only by a metal-insulator-metal (MIM) structure. Since a thick insulating layer (inorganic material) is to be used as a dielectric material, it is difficult to realize high electrostatic capacity per a unit area. Therefore, in order to secure a uniform level of electrostatic capacity, the area of the capacitor is to be increased.

SUMMARY OF CERTAIN INVENTIVE ASPECTS

One aspect is a method of manufacturing an organic light emitting display. The method includes forming a gate electrode and a lower electrode on a substrate, forming a first insulating layer over the gate electrode and the lower electrode, forming an oxide semiconductor layer on the first insulating layer, and patterning the oxide semiconductor layer to form an active layer on the first insulating layer over the gate electrode and to form an upper electrode on the first insulating layer over the lower electrode. The method also includes forming a second insulating layer over the active layer and the upper electrode, forming source and drain electrodes coupled to the active layer on the second insulating layer, forming a third insulating layer including an organic material over the source and drain electrodes, patterning the third insulating layer to expose at least one of the source and drain electrodes, and bathing the third insulating layer and the exposed portion of the exposed electrode with a solution including H. The method also includes forming a first electrode coupled to the source or drain electrode on the third insulating layer, forming a pixel defining layer over the first electrode, where the pixel defining layer has an opening exposing the first electrode in an emission region, forming an organic light emitting layer on the exposed first electrode, and forming a second electrode on the organic light emitting layer.

Another aspect is a method of manufacturing a display device. The method includes forming a transistor on a substrate, where the transistor includes a gate electrode, and drain and source electrodes connected to an active layer which includes an oxide semiconductor material. The method also includes forming a capacitor on the substrate, where the capacitor includes first and second electrodes separated by an insulating layer, where at least one of the electrodes includes the oxide semiconductor material. The method also includes forming an additional insulating layer over the transistor and the capacitor, and bathing the additional insulating layer in a solution including hydrogen, where the hydrogen diffuses into the oxide semiconductor material of the capacitor.

BRIEF DESCRIPTION OF THE DRAWINGS

The accompanying drawings, together with the specification, illustrate exemplary embodiments, and, together with the description, serve to explain various inventive principles.

DETAILED DESCRIPTION OF CERTAIN INVENTIVE EMBODIMENTS

Figure 1:
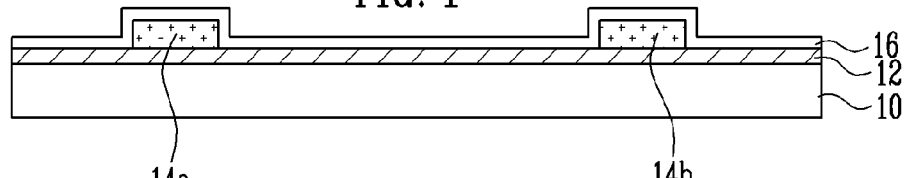
FIGS. 1 to 7 are cross-sectional views illustrating a method of manufacturing an organic light emitting display.

In the following detailed description, certain exemplary embodiments are shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements.

Hereinafter, various aspects of certain embodiments are described in detail with reference to the accompanying drawings.

FIGS. 1 to 7 are cross-sectional views illustrating a method of manufacturing an organic light emitting display.

Referring to FIG. 1, a buffer layer 12 is formed on an insulating substrate 10 made of a transparent or substantially transparent material, such as, glass or plastic. After forming a metal layer on the buffer layer 12, the metal layer is patterned to form the gate electrode 14a of a thin film transistor (TFT) and the lower electrode 14b of a capacitor. Then, a first insulating layer 16 is formed on the buffer layer 12, the gate electrode 14a, and the lower electrode 14b. The metal layer may be made of, for example, metals such as W, Ti, Mo, Ag, Ta, Al, Cu, Au, Cr, and Nb or an alloy of the above metals. The gate insulating layer of the TFT and the first insulating layer used as the dielectric material of the capacitor may be made of, for example, SiOx or SiNx.

Figure 2:
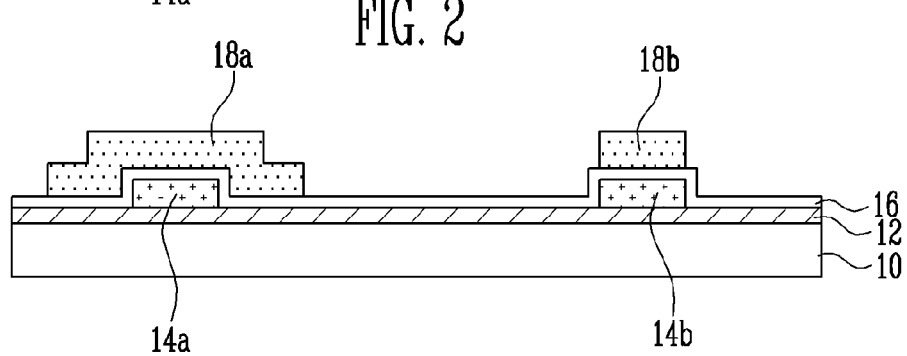

Referring to FIG. 2, after forming an oxide semiconductor layer on the first insulating layer 16, the oxide semiconductor layer is patterned to form an active layer 18a on the insulating layer 16 formed on the gate electrode 14a and to form an upper electrode 18b on the insulating layer 16 formed on the lower electrode 14b. The oxide semiconductor layer may be made of, for example, ZnO or ZnO doped with In, Ga, Hf, and Sn, for example, InZnO (IZO), GaInZnO (GIZO), and HfIn-ZnO.

Figure 3:
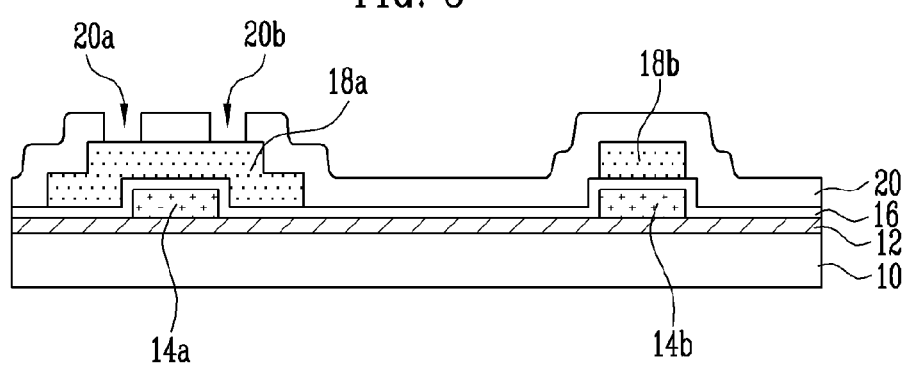

Referring to FIG. 3, a second insulating layer 20 is formed on the first insulating layer 16, the active layer 18a, and the upper electrode 18b. A contact hole 20a is formed to expose regions (source and drain regions) of the active layer 18a. The second insulating layer 20 may be made of, for example, silicon oxide, silicon nitride, or gallium oxide.

Figure 4:
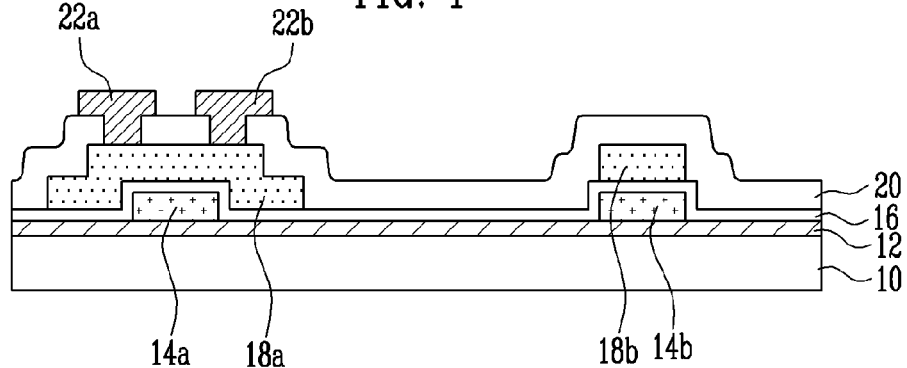

Referring to FIG. 4, after a metal layer is formed on the second insulating layer 20 in the contact holes 20a and 20b, the metal layer is patterned to form source and drain electrodes 22a and 22b. The source and drain electrodes 22a and 22b are coupled to the active layer 18a in the source and drain regions. The metal layer may be made of, for example, metals such as W, Ti, Mo, Ag, Ta, Al, Cu, Au, Cr, and Nb or an alloy thereof.

In a process of patterning the metal layer in order to form the source and drain electrodes 22a and 22b, the second insulating layer 20 may be used as an etch stop layer. The patterning process may include dry etching. However, since the second insulating layer 20 is formed on the active layer 18a in a channel region, it is possible to prevent certain electric characteristics of the TFT from being harmed due to damage of the active layer 18a.

Figure 5:
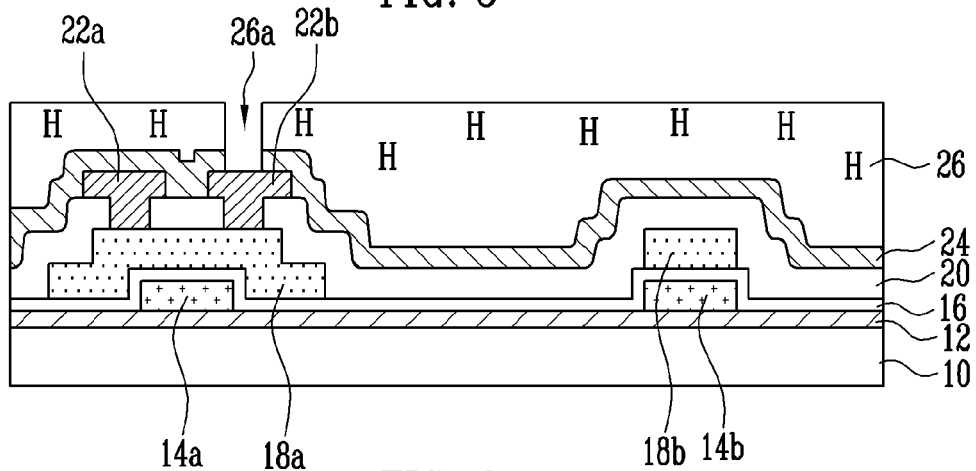

Referring to FIG. 5, a third insulating layer 24 is formed on the second insulating layer 20, and the source and drain electrodes 22a and 22b. A fourth insulating layer 26 made of an organic material such as acrylic and polyimide is formed on the third insulating layer 24 in order to planarize the surface. The fourth insulating layer 26 and the third insulating layer 24 are subsequently patterned to form a via hole 26a so that the source or drain electrode 22a or 22b are exposed. In some embodiments, the third insulating layer 24 is omitted.

After forming the via hole 26a in the third insulating layer 24 and the fourth insulating layer 26, bathing is performed with a solution containing H (hydrogen ions). In some embodiments, the bathing removes etching residue and contaminants. In some embodiments, $H_2O$ is used as a bathing solution in order to have H effectively permeate the fourth insulating layer 26, which is made of the organic material.

Figure 6:
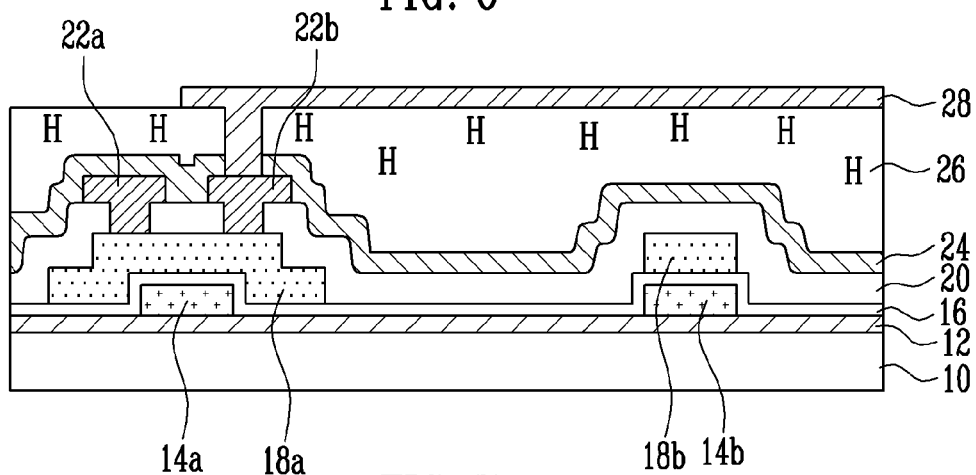

Referring to FIG. 6, after forming a transparent conductive layer such as indium tin oxide (ITO) and indium zinc oxide (IZO) on the fourth insulating layer 26 to contact the source or drain electrode 22a or 22b. The transparent conductive layer is patterned to form the anode electrode 28 coupled to the source or drain electrode 22a or 22b. In this embodiment, the anode electrode 28 is formed to completely overlap the upper electrode 18b and to only partially overlap the active layer 18a.

Figure 7:
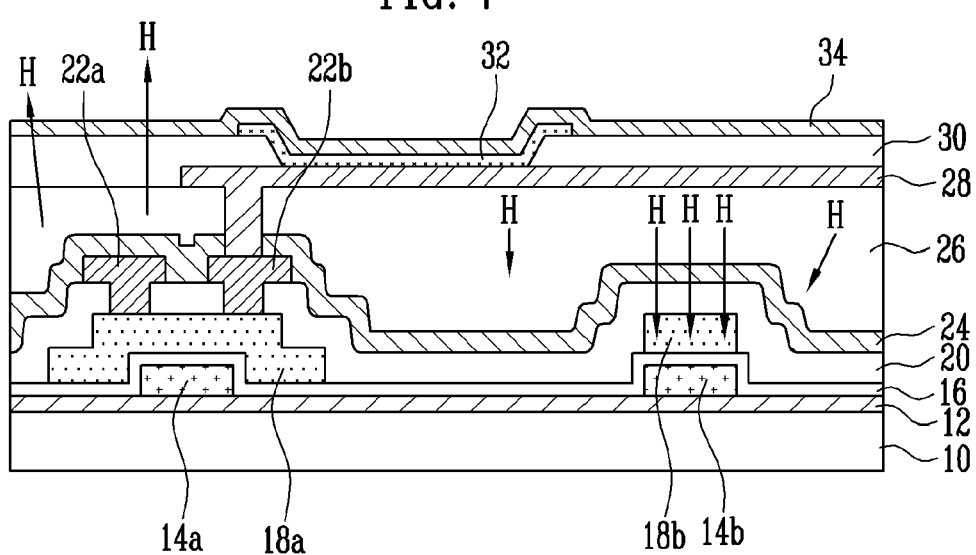

Referring to FIG. 7, after forming the pixel defining layer 30 on the third insulating layer 26 and the anode electrode 28, the pixel defining layer 30 is patterned to expose the anode electrode 28 in the emission region. An organic light emitting layer 32 is subsequently formed on the exposed anode electrode 28 and a cathode electrode 34 is formed on the pixel defining layer 30 and the organic light emitting layer 32.

As shown in FIGS. 6 and 7, because the anode electrode 28 is impermeable to the H, and covers or encapsulates the upper electrode 18b, the H near the upper electrode 18b does not diffuse to the outside, but diffuses to the upper electrode 18b. The concentration of H of the oxide semiconductor layer consequently increases. When the concentration of H in the upper electrode 18b is sufficient, because of the number of carriers, the oxide semiconductor layer has conductivity high enough to be effective as the upper electrode 18b. In contrast, because the active layer 18a is not covered or encapsulated by the anode electrode 28, H that permeates the fourth insulating layer 26 near the active layer 18a diffuses to the outside via the diffusion path from the active layer 18a through the second, third, and fourth insulating layers 20, 24, and 26. In order to promote the diffusion of H, a heat treatment may be included in the manufacturing processes of FIGS. 6 and 7.

In the organic light emitting display according to the present invention, a signal provided from the outside is stored in the capacitor and a signal is provided to the anode electrode 28 by the TFT. Therefore, when a voltage is applied to the anode electrode 28 and the cathode electrode 34, holes injected through the anode electrode 28 and electrons injected through the cathode electrode 34 recombine with each other in the organic light emitting layer 32. Light is emitted from the organic light emitting layer 32 due to energy differences generated in this process and is projected to the outside to display characters or an image.

While various inventive aspects have been described, it is to be understood that the invention is not limited to the disclosed embodiments, but, on the contrary, is intended to cover various modifications and equivalent arrangements.

What is claimed is:

1. A method of manufacturing an organic light emitting display, the method comprising:
    forming a gate electrode and a lower electrode on a substrate;
    forming a first insulating layer over the gate electrode and the lower electrode;
    forming an oxide semiconductor layer on the first insulating layer;
    patterning the oxide semiconductor layer to form an active layer on the first insulating layer over the gate electrode and to form an upper electrode on the first insulating layer over the lower electrode;
    forming a second insulating layer over the active layer and the upper electrode;
    forming source and drain electrodes coupled to the active layer on the second insulating layer;
    forming a third insulating layer comprising an organic material over the source and drain electrodes;
    patterning the third insulating layer to expose at least one of the source and drain electrodes;
    bathing the third insulating layer and the exposed portion of the exposed electrode with a solution including H;
    forming a first electrode coupled to the source or drain electrode on the third insulating layer;
    forming a pixel defining layer over the first electrode, wherein the pixel defining layer has an opening exposing the first electrode in an emission region;

forming an organic light emitting layer on the exposed first electrode; and forming a second electrode on the organic light emitting layer.

2. The method as claimed in claim 1, wherein the gate electrode and the lower electrode each comprise a metal.

3. The method as claimed in claim 1, wherein the first insulating layer comprises SiO or SiNx.

4. The method as claimed in claim 1, wherein the oxide semiconductor layer comprises ZnO.

5. The method as claimed in claim 4, wherein the oxide semiconductor layer is doped with at least one ion of Ga, In, Hf, and Sn.

6. The method as claimed in claim 1, wherein the second insulating layer is used as an etch stop layer in an etch process of forming the source and drain electrodes.

7. The method as claimed in claim 1, wherein the organic material of the third insulating layer comprises acrylic or polyimide.

8. The method as claimed in claim 1, wherein the bathing solution comprises $H_2O$.

9. The method as claimed in claim 1, wherein the first electrode overlaps the upper electrode.

10. The method as claimed in claim 1, further comprising heating the display after forming the pixel defining layer.

11. The method as claimed in claim 1, wherein the bathing cleanses at least one of the third insulating layer and the exposed electrode.

12. The method as claimed in claim 1, wherein the first electrode only partially overlaps the active layer.

* * * * *